United States Patent
Ma et al.

(10) Patent No.: US 10,555,443 B2
(45) Date of Patent: Feb. 4, 2020

(54) DISPLAY DEVICE INCLUDING A BACK COVER WITH RECESS TO PROVIDE COOLING TO A HEAT GENERATING ELEMENT

(71) Applicant: BOE TECHNOLOGY GROUP CO., LTD., Beijing (CN)

(72) Inventors: Yongda Ma, Beijing (CN); Xinyin Wu, Beijing (CN); Jianbo Xian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/527,044

(22) PCT Filed: Jun. 7, 2016

(86) PCT No.: PCT/CN2016/085126
§ 371 (c)(1),
(2) Date: May 16, 2017

(87) PCT Pub. No.: WO2017/133153
PCT Pub. Date: Aug. 10, 2017

(65) Prior Publication Data
US 2018/0329252 A1 Nov. 15, 2018

(30) Foreign Application Priority Data
Feb. 2, 2016 (CN) .................... 2016 2 0107014 U

(51) Int. Cl.
*H05K 7/20* (2006.01)
*G02F 1/1333* (2006.01)
*G02F 1/1345* (2006.01)

(52) U.S. Cl.
CPC ..... *H05K 7/20963* (2013.01); *G02F 1/13452* (2013.01); *G02F 1/133308* (2013.01);
(Continued)

(58) Field of Classification Search
CPC .......... G02F 1/133385; G02F 1/13452; H05K 7/20963–20972
(Continued)

(56) References Cited

U.S. PATENT DOCUMENTS

| 6,833,674 B2 * | 12/2004 | Kaneko | H05K 7/20972 313/11 |
| 7,447,030 B2 * | 11/2008 | Hwang | F28D 15/0233 165/104.33 |

(Continued)

FOREIGN PATENT DOCUMENTS

| CN | 203193781 U | 9/2013 |
| CN | 203465910 U | 3/2014 |
| CN | 104640414 A | 5/2015 |

OTHER PUBLICATIONS

International Search Report and Written Opinion for Application No. PCT/CN2016/085126, dated Oct. 28, 2016, 9 Pages.

*Primary Examiner* — Zachary Pape
(74) *Attorney, Agent, or Firm* — Brooks Kushman P.C.

(57) ABSTRACT

The present disclosure relates to a display device including a circuit board, a heating element arranged on the circuit board, an insulating and heat conducting structure connected to the heating element, a heat radiating plate connected to the insulating and heat conducting structure, and a back cover provided with a recess, wherein the heat radiating plate is arranged in the recess and is in the direct contact with an exterior of the display device.

18 Claims, 3 Drawing Sheets

(52) U.S. Cl.
CPC .......... *G02F 1/133385* (2013.01); *G02F 2001/133314* (2013.01); *H05K 7/20145* (2013.01); *H05K 7/20418* (2013.01); *H05K 7/20972* (2013.01)

(58) Field of Classification Search
USPC .............................. 361/704–719, 695–697
See application file for complete search history.

(56) References Cited

U.S. PATENT DOCUMENTS

| | | | | |
|---|---|---|---|---|
| 7,817,429 | B2* | 10/2010 | Choi | H05K 7/20963 165/104.33 |
| 7,830,660 | B2* | 11/2010 | Kang | G02F 1/133385 165/185 |
| 8,111,513 | B2* | 2/2012 | Yeh | G06F 1/20 165/104.33 |
| 9,049,804 | B2* | 6/2015 | Lang | H05K 7/20963 |
| 10,256,170 | B2* | 4/2019 | Sueyoshi | H01L 23/467 |
| 2002/0014840 | A1* | 2/2002 | Kaneko | H05K 7/20963 313/587 |
| 2006/0139887 | A1* | 6/2006 | Kameda | H01L 23/427 361/704 |
| 2011/0192568 | A1* | 8/2011 | Hsieh | H05K 7/20927 165/48.1 |
| 2013/0141866 | A1* | 6/2013 | Refai-Ahmed | H01L 23/3672 361/679.54 |
| 2014/0085564 | A1* | 3/2014 | Hendren | G02F 1/133385 349/58 |
| 2014/0352926 | A1* | 12/2014 | Sun | G06F 1/203 165/104.26 |
| 2015/0075186 | A1* | 3/2015 | Prajapati | G06F 1/20 62/3.7 |
| 2015/0131225 | A1* | 5/2015 | Chang | G06F 1/203 361/679.54 |
| 2015/0226997 | A1* | 8/2015 | Tomomasa | G02F 1/133308 348/794 |
| 2016/0054515 | A1* | 2/2016 | Zhou | G02F 1/133308 349/58 |
| 2016/0276619 | A1* | 9/2016 | Cheng | H01L 51/56 |

* cited by examiner

DISPLAY DEVICE INCLUDING A BACK COVER WITH RECESS TO PROVIDE COOLING TO A HEAT GENERATING ELEMENT

CROSS-REFERENCE TO RELATED APPLICATIONS

This application is the U.S. national phase of PCT Application No. PCT/CN2016/085126 filed on Jun. 7, 2016, which claims priority to Chinese Patent Application No. 201620107014.8 filed on Feb. 2, 2016, the disclosures of which are incorporated in their entirety by reference herein.

TECHNICAL FIELD

The present disclosure relates to the field of liquid crystal product manufacturing technology, and in particularly to a display device.

BACKGROUND

As a heat radiating way of a display device, a heat radiating plate is usually arranged inside the casing, and heat generated by an integrated heating element inside the casing is rapidly radiated into air inside the casing by the heat radiating plate to realize a convection heat radiation, which exacerbates the accumulation of dust inside the casing, and the dust accumulations on the integrated heating element inside the casing has an influence on a service life of the heating element. Meanwhile, the display effect is affected by the dust entering a display module through a gap for installation.

SUMMARY

In order to solve the above technical problems, the present disclosure provides a display device to improve heat radiation efficiency and reduce dust entering into the display device.

In order to achieve the above object, according to a technical solution in the present disclosure, a display device is provided, which includes:

a circuit board;
a heating element arranged on the circuit board;
an insulating and heat conducting structure connected to the heating element;
a heat radiating plate connected to the insulating and heat conducting structure; and
a back cover provided with a recess;
wherein the heat radiating plate is arranged in the recess and is in direct contact with an exterior of the display device.

Optionally, an auxiliary heat radiating structure is arranged between the insulating and heat conducting structure and the heating element.

Optionally, the auxiliary heat radiating structure is provided with a first heat radiating channel, a side of the first heat radiating channel is connected to the heating element, and an opposite side of the first heat radiating channel is connected to the insulating and heat conducting structure.

Optionally, the auxiliary heat radiating structure is a heat conducting block including a plurality of first heat radiating channels, the heat conducting block includes a heat absorbing surface and a heat radiating surface, the heat absorbing surface is in contact with the heating element, the heat radiating surface is connected to the heat radiating plate through the insulating and heat conducting structure, and the plurality of first heat radiating channels penetrates through the heat conducting block in a length direction or a width direction of the circuit board.

Optionally, the heat absorbing surface and the heat radiating surface are end surfaces of the heat conducting block parallel to a surface of the circuit board where the heating element is mounted.

The heat absorbing surface and the heat radiating surface are two end surfaces of the heat conducting block, and an angle is formed between the heat absorbing surface and the surface of the circuit board where the heating element is mounted, and the angle is in a range of 0 degree~15 degrees.

Optionally, the heat radiating plate is provided with a heat radiating fin.

Optionally, the heat radiating fin is arranged on an outer surface of the heat radiating plate, the back cover is provided with an air convection groove in an area on both sides of the heat radiating fin, and the air convection groove extends in an identical direction to the heat radiating fin.

Optionally, the back cover is provided with a heat radiating fin in an area around the heat radiating plate, an end of the heat radiating fin arranged on the back cover is connected to the heat radiating plate.

Optionally, the recess is an air permeable portion arranged in the back cover.

Optionally, the air permeable portion is an opening arranged in the back cover.

Optionally, the heat radiating plate covers the air permeable portion.

Optionally, the air permeable portion is a trumpet-shaped opening structure arranged in the back cover, the trumpet-shaped opening structure includes an opening arranged in the back cover and a side wall located on a periphery of the opening and tilted outwards.

Optionally, the heat radiating plate covers the opening.

Optionally, the display device further includes: a heat radiating cavity arranged separately from an inner cavity of the display device, wherein the heat radiating cavity includes a first opening arranged in the back cover, a second opening arranged in the side wall, and an airflow guiding member, the airflow guiding member is arranged inside the heat radiating cavity, and the second opening faces the heat radiating plate.

Optionally, the airflow guiding member includes a fan.

Optionally, the back cover is integrally formed with the heat radiating plate, and the heat radiating plate is a bottom wall of the recess.

Optionally, the heat radiating plate is made of insulating and heat conducting material.

Optionally, the heating element is an integrated chip on the circuit board, and the insulating and heat conducting structure is connected to the integrated chip on the circuit board through a heat conducting adhesive.

Optionally, the recess is depressed towards an interior of the display device.

The present disclosure has the following beneficial effects: an exposed arrangement of the heat radiating plate makes the heat radiating plate directly connected with the exterior of the display device, thereby improving the heat radiation effect, preventing dusts from entering the inner cavity of the display device, and reducing the accumulation of dusts in the display device due to heat radiation convection.

DETAILED DESCRIPTION

Features and principles of the present disclosure will be described hereinafter in detail in conjunction with the drawings. The given embodiments are merely used to illustrate the present disclosure, rather than to limit the protection scope of the present disclosure.

Figure 1:
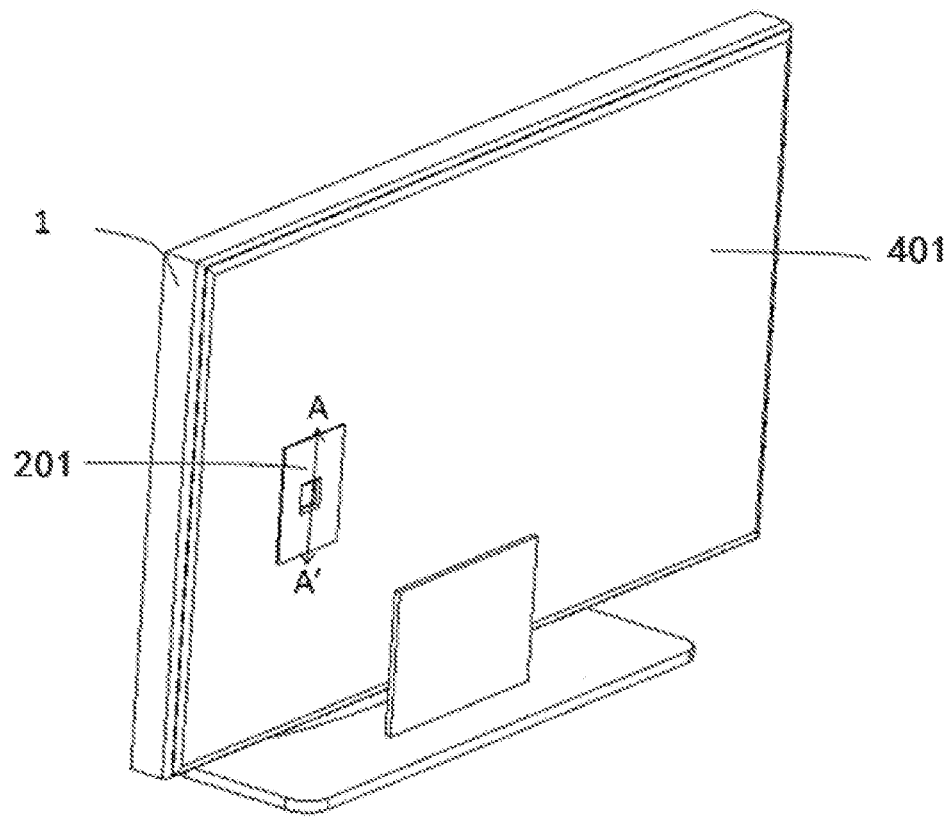
FIG. 1 is a schematic diagram showing a structure of a display device according to the present disclosure.
Figure 2:
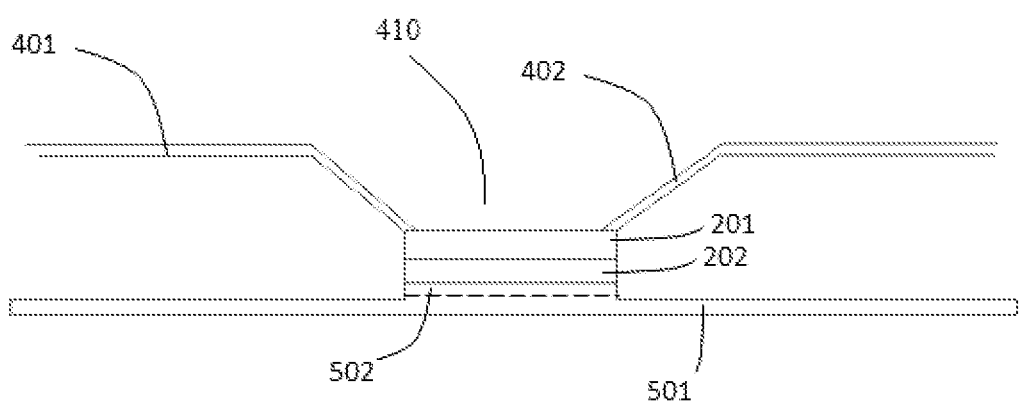
FIG. 2 is a sectional view along line A-A in FIG. 1 according to at least some embodiments.

As shown in FIGS. 1 and 2, in order to reduce the accumulation of dust caused during a heat radiating process, the present disclosure provides in some embodiments a display device, including:

a heating element arranged on a circuit board of a display device 1;

an insulating and heat conducting structure 202 connected to the heating element;

a heat radiating plate 201 connected to the insulating and heat conducting structure 202; and a back cover 401 provided with a recess 410, wherein the heat radiating plate 201 is arranged in the recess 410 and is in direct contact with an exterior of the display device.

The heat radiating plate 201 is arranged in the back cover 401 in an exposed manner, and conducts heat of the heating element out of the display device 201 directly, which reduces the accumulation of dust in the display device due to the heat radiation convection while improving the heat radiating effect, compared with heat radiating ways in the related art.

Furthermore, the heating element is an integrated chip 502 on the circuit board 501, and the insulating and heat conducting structure is connected to the integrated chip 502 on the circuit board 501 through a heat conducting adhesive.

The circuit board 501 is a component having a great demand for heat radiation in the display device. In an optional embodiment of the present disclosure, a circuit board is used as an example to specifically describe the display device in embodiments of the present disclosure, and to facilitate the heat radiation, the heat radiating plate is connected to the integrated chip 502 on circuit board.

Optionally, the insulating and heat conducting structure 202 is connected to the integrated chip 502 on the circuit board through a heat conducting adhesive, but the present disclosure is not limited thereto.

Optionally, the heat radiating plate 201 is made of insulating and heat conducting material.

Figure 6:
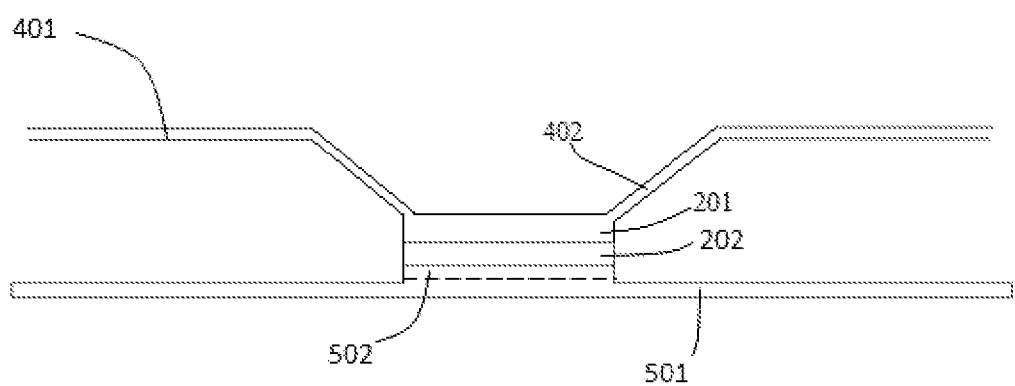
FIG. 6 is a cross-sectional view along line A-A in FIG. 1 according to at least some embodiments.

Optionally, in some embodiments, as shown in FIG. 6, the back cover 401 may be integrally formed with the heat radiating plate 201, and in this case, the heat radiating plate is a bottom wall of the recess. The back cover 401 of the display device is integrally formed with the heat radiating plate 201, which may simplify the manufacturing process.

Optionally, in some embodiments, as shown in FIG. 2, the recess 410 may be an air permeable portion, such as an opening, arranged in the back cover 401. In one embodiment, as shown in FIG. 2, the heat radiating plate 201 may cover the air permeable portion.

Furthermore, the air permeable portion is a trumpet-shaped opening structure arranged in the back cover 401, the trumpet-shaped opening structure includes an opening arranged in the back cover 401 and a side wall 402 located on a periphery of the opening and tilted outwards. In some embodiments, as shown in FIG. 2, the heat radiating plate 201 may cover the opening.

Figure 3:
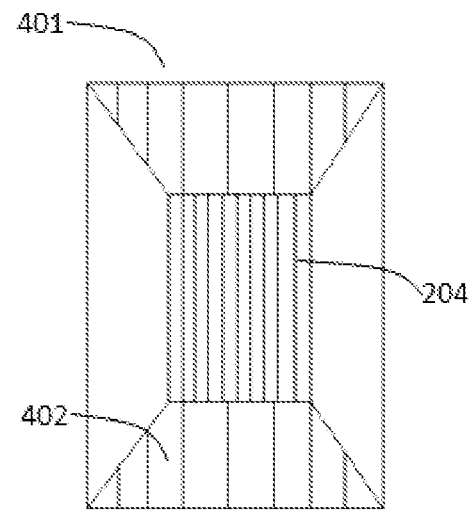
FIG. 3 is a schematic diagram showing part of a structure of a back cover of the display device according to some embodiments of the present disclosure.

In order to further improve the heat radiating effect, as shown in FIG. 3, the heat radiating plate 201 is provided with a heat radiating fin 204.

There may be many ways to arrange the heat radiating fin 204, as long as which may realize the purpose of facilitating the heat radiation. In embodiments of the present disclosure, the heat radiating fin may be arranged in the following two ways.

First way: as shown in FIG. 3, the heat radiating fin 204 is arranged on an outer surface of the heat radiating plate 201, the back cover 401 is provided with air convection grooves 402 in areas on both sides of the heat radiating fin 204, and the air convection grooves 402 extend in an identical direction to the heat radiating fin 204.

Figure 4:
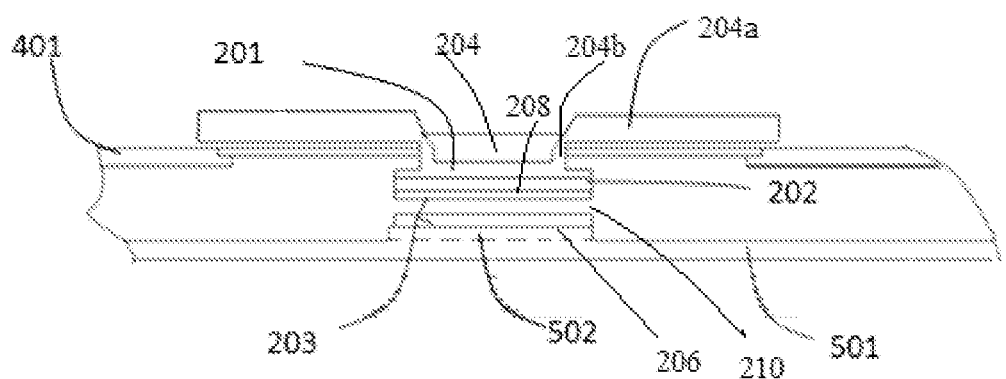
FIG. 4 is a cross-sectional view along line A-A in FIG. 1 according to at least some embodiments.

Second way: furthermore, to facilitate the heat radiation, as shown in FIG. 4, the back cover is provided with a heat radiating fin 204a in an area around the heat radiating plate 201, an end 204b of the heat radiating fin 204a arranged on the back cover is connected to the heat radiating plate 201.

Figure 5:
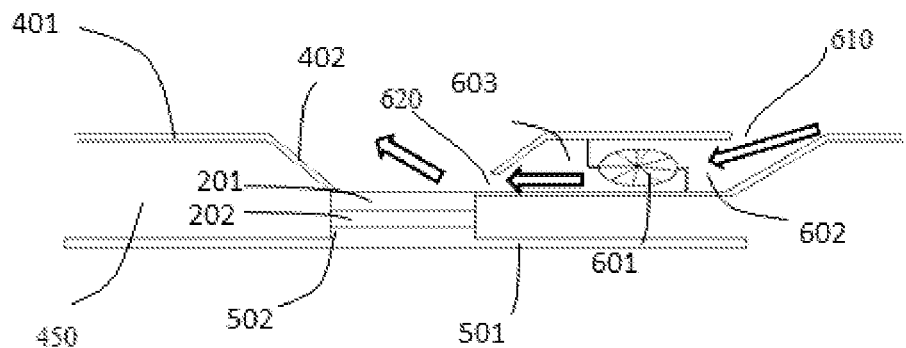
FIG. 5 is a cross-sectional view along line A-A in FIG. 1 according to at least some embodiments.

As shown in FIG. 5, in order to further improve the heat radiating effect, the display device according to the embodiment further includes: a heat radiating cavity arranged separately from an inner cavity 450 of the display device. The heat radiating cavity includes a first opening 610 arranged in the back cover 401, a second opening 620 arranged in the side wall 402 and an airflow guiding member 601. The airflow guiding member 601 is arranged inside the heat radiating cavity, so that the outside air flows to the heat radiating cavity from the first opening, and flows to the heat radiating plate from the second opening.

Optionally, the airflow guiding member 601 includes a fan.

As shown in FIG. 5, the heat radiating cavity is arranged separately from an inner cavity of the display device, the airflow guiding member 601 in the heat radiating cavity divides the heat radiating cavity into an inlet cavity 602 including the first opening and an outlet cavity 603 including the second opening. In FIG. 5, the airflow direction is indicated by an arrow, the outside air flows into the heat radiating cavity from the first opening, and flows out from the second opening, and then flows through the surface of the heat radiating plate, thus enhancing the heat radiating effect.

The heat radiating cavity arranged separately from the inner cavity of the display device makes the heat radiation airflow not enter the inner cavity of the display device, which prevents the heat radiation airflow from bringing dusts into the inner cavity of the display device while improving the heat radiating effect, thus ensuring the inner cavity of the display device being clean.

Optionally, the airflow guiding member 601 is arranged on the back cover 401 or on the backboard of the display device.

Furthermore, the heating element is connected to the heat radiating plate 201 through the insulating and heat conducting structure 202. The arrangement of the insulating and heat conducting structure 202 further improves the heat radiating effect, and insures the safety of personnel.

In order to further improve the heat radiating effect, as shown in FIG. 4, an auxiliary heat radiating structure 203 is arranged between the insulating and heat conducting structure 202 and the heating element.

Optionally, as shown in FIG. 4, the auxiliary heat radiating structure 203 is provided with a first heat radiating channel, a side of the first heat radiating channel is connected to the heating element, and an opposite side of the first heat radiating channel is connected to the insulating and heat conducting structure 202.

Optionally, the auxiliary heat radiating structure 203 is a hollow structure. For example, as shown in FIG. 4, the auxiliary heat radiating structure 203 may be a heat conducting block including a plurality of first heat radiating channels 210, the heat absorbing surface 206 of the heat conducting block (e.g., a bottom surface, when the display device is in the position as shown in FIG. 4) is in contact with the heating element such as the integrated chip 502, and the heat radiating surface 208 of the heat conducting block (e.g., a top surface, when the display device is in the position as shown in FIG. 4) is connected to the heat radiating plate 201 through the insulating and heat conducting structure 202. The plurality of first heat radiating channels penetrate through the heat conducting block in a direction approximately parallel to the circuit board 501 (a length direction or a width direction of the circuit board 501, when the display device is in the position as shown in FIG. 4). In this way, heat generated when the heating element, such as the integrated chip 502, is working, is absorbed by the heat absorbing surface 206 of the heat conducting block. A part of the heat absorbed by the heat absorbing surface 206 is transferred to the heat radiating surface 208, and then transferred to the heat radiating plate 201, and further radiated into the external environment of the display device. The rest of the heat absorbed by the heat absorbing surface 206 is absorbed by the airflow flowing through the first heat radiating channel 210 and is radiated into the internal environment of the inner cavity 450. In this way, the heat radiation may be accelerated, and the accumulation of heat which affects the performance of the integrated chip 502 is prevented. In one embodiment, the heat absorbing surface 206 and the heat radiating surface 208 are end surfaces of the heat conducting block parallel to a surface of the circuit board 501 where the heating element is mounted. Certainly, in other embodiments, an angle may be formed between the heat absorbing surface 206 and the surface of the circuit board 501 where the heating element is mounted, and the angle is in a range of 0 degree~15 degrees.

The arrangement of the insulating and heat conducting structure 202 and the auxiliary heat radiating structure 203 reduces a limitation of a structure of the air permeable portion, and makes the tilt of the side wall 402 of the air permeable portion not hampered by a distance between the back cover 401 and the heating element, and the air permeable portion may even eliminate the arrangement of the side wall 402 as shown in FIG. 4.

The above are merely optional embodiments of the present disclosure. It should be noted that, a person skilled in the art may make improvements and modifications without departing from the principle of the present disclosure, and these improvements and modifications shall also fall within the scope of the present disclosure.

What is claimed is:

1. A display device, comprising:
   a circuit board;
   a heating element arranged on the circuit board;
   an insulating and heat conducting structure connected to the heating element;
   a heat radiating plate connected to the insulating and heat conducting structure; and
   a back cover provided with a recess,
   wherein the heat radiating plate is arranged in the recess and is in direct contact with an exterior of the display device,
   wherein an auxiliary heat radiating structure is arranged between the insulating and heat conducting structure and the heating element, and
   wherein the auxiliary heat radiating structure is provided with a first heat radiating channel, a side of the first heat radiating channel is connected to the heating element, and an opposite side of the first heat radiating channel is connected to the insulating and heat conducting structure.

2. The display device according to claim 1, wherein the heat radiating plate is provided with a heat radiating fin.

3. The display device according to claim 2, wherein the heat radiating fin is arranged on an outer surface of the heat radiating plate, the back cover is provided with an air convection groove in an area on both sides of the heat radiating fin, and the air convection groove extends in an identical direction to the heat radiating fin.

4. The display device according to claim 3, wherein the back cover is provided with a heat radiating fin in an area around the heat radiating plate, an end of the heat radiating fin arranged on the back cover is connected to the heat radiating plate.

5. The display device according to claim 1, wherein the recess is an air permeable portion arranged in the back cover.

6. The display device according to claim 5, wherein the air permeable portion is an opening arranged in the back cover.

7. The display device according to claim 5, wherein the heat radiating plate covers the air permeable portion.

8. The display device according to claim 5, wherein the air permeable portion is a trumpet-shaped opening structure arranged in the back cover, the trumpet-shaped opening structure comprises an opening arranged in the back cover and a side wall located on a periphery of the opening and tilted outwards.

9. The display device according to claim 8, wherein the heat radiating plate covers the opening.

10. The display device according to claim 1, wherein the back cover is integrally formed with the heat radiating plate, and the heat radiating plate is a bottom wall of the recess.

11. The display device according to claim 1, wherein the heat radiating plate is made of insulating and heat conducting material.

12. The display device according to claim 1, wherein the heating element is an integrated chip on the circuit board, and the insulating and heat conducting structure is connected to the integrated chip on the circuit board through a heat conducting adhesive.

13. The display device according to claim 1, wherein the recess is depressed towards an interior of the display device.

14. A display device, comprising:
   a circuit board;
   a heating element arranged on the circuit board;
   an insulating and heat conducting structure connected to the heating element;
   a heat radiating plate connected to the insulating and heat conducting structure; and a back cover provided with a recess,
wherein the heat radiating plate is arranged in the recess and is in direct contact with an exterior of the display device,
wherein an auxiliary heat radiating structure is arranged between the insulating and heat conducting structure and the heating element, and
wherein the auxiliary heat radiating structure is a heat conducting block comprising a plurality of first heat radiating channels, the heat conducting block comprises a heat absorbing surface and a heat radiating surface, the heat absorbing surface is in contact with the heating element, the heat radiating surface is connected to the heat radiating plate through the insulating and heat conducting structure, and the plurality of first heat radiating channels penetrates through the heat conducting block in a length direction or a width direction of the circuit board.

15. The display device according to claim 14, wherein the heat absorbing surface and the heat radiating surface are end surfaces of the heat conducting block parallel to a surface of the circuit board where the heating element is mounted.

16. The display device according to claim 14, wherein the heat absorbing surface and the heat radiating surface are two end surfaces of the heat conducting block, an angle is formed between the heat absorbing surface and the surface of the circuit board where the heating element is mounted, and the angle is in a range of 0 degree~15 degrees.

17. A display device, comprising:
a circuit board;
a heating element arranged on the circuit board;
an insulating and heat conducting structure connected to the heating element;
a heat radiating plate connected to the insulating and heat conducting structure; and
a back cover provided with a recess,
wherein the heat radiating plate is arranged in the recess and is in direct contact with an exterior of the display device,
wherein the recess is an air permeable portion arranged in the back cover,
wherein the air permeable portion is a trumpet-shaped opening structure arranged in the back cover, the trumpet-shaped opening structure comprises an opening arranged in the back cover and a side wall located on a periphery of the opening and tilted outwards,
wherein the display device further comprises a heat radiating cavity arranged separately from an inner cavity of the display device, wherein the heat radiating cavity comprises a first opening arranged in the back cover, a second opening arranged in the side wall, and an airflow guiding member, the airflow guiding member is arranged inside the heat radiating cavity, and the second opening faces the heat radiating plate.

18. The display device according to claim 17, wherein the airflow guiding member comprises a fan.

\* \* \* \* \*